(12) United States Patent  
De Bosscher et al.

(10) Patent No.: US 6,322,679 B1
(45) Date of Patent: Nov. 27, 2001

(54) PLANAR MAGNETRON WITH MOVING MAGNET ASSEMBLY

(75) Inventors: Wilmert De Bosscher, Drongen; Dirk Cnockaert, Deinze, both of (BE)

(73) Assignee: Sinvaco N.V. (BE)

( * ) Notice: Subject to any disclaimer, the term of this patent is extended or adjusted under 35 U.S.C. 154(b) by 0 days.

(21) Appl. No.: 09/554,790
(22) PCT Filed: Nov. 17, 1998
(86) PCT No.: PCT/EP98/07353
   § 371 Date: Jul. 6, 2000
   § 102(e) Date: Jul. 6, 2000
(87) PCT Pub. No.: WO99/26274
   PCT Pub. Date: May 27, 1999

(30) Foreign Application Priority Data

Nov. 19, 1997  (EP) .................................................. 97120218

(51) Int. Cl.$^7$ ........................................................... C23C 14/34
(52) U.S. Cl. ............................................. 204/298.2; 204/192.12
(58) Field of Search ............................. 204/298.2, 192.12

(56) References Cited

U.S. PATENT DOCUMENTS

| | | | |
|---|---|---|---|
| 4,714,536 | * 12/1987 | Freman et al. | 204/298.2 |
| 4,902,931 | * 2/1990 | Veltrop et al. | 204/298.2 |
| 5,171,415 | * 12/1992 | Miller et al. | 204/298.2 |
| 5,188,717 | 2/1993 | Broadbent et al. | |
| 5,328,585 | * 7/1994 | Stevenson et al. | 204/298.2 |
| 5,833,815 | * 11/1998 | Kim et al. | 204/298.2 |
| 5,855,744 | * 1/1999 | Halsey et al. | 204/298.2 |
| 5,873,989 | * 2/1999 | Hughes et al. | 204/298.2 |
| 5,907,220 | * 5/1999 | Tepman et al. | 204/298.2 |

FOREIGN PATENT DOCUMENTS 0 213 922 A2  3/1987  (EP) .
0 439 360 A2  7/1991  (EP) .

* cited by examiner

*Primary Examiner*—Nam Nguyen
*Assistant Examiner*—Gregg Cantelmo
(74) *Attorney, Agent, or Firm*—Skjerven Morrill MacPherson, LLP; Jack V. Musgrove

(57) ABSTRACT

The present invention provides a planar magnetron including a surface for mounting a planar substantially polygonal target (2) having a substantially central target area for sputtering onto a substrate. The magnetron comprises an array of magnets (4) defining a closed loop magnetic field for generating an elongated plasma race-track above the target (2). Means for establishing cyclical, relative, substantially translational movement between the race-track and the target support surface are provided, the substantially translational movement being substantially parallel to this surface and the trace of the substantially translational movement being a two-dimensional figure. The periphery of the race-track lies substantially within said substantially central target area throughout each cycle, the establishing means being adapted to provide a substantially uniform erosion of the target (2) at least within said substantially central target area.

33 Claims, 12 Drawing Sheets

PLANAR MAGNETRON WITH MOVING MAGNET ASSEMBLY

The present invention relates to an improved planar magnetron with a magnet assembly suitable for sputtering or reactive sputtering of materials from a cathode target onto a substrate as well as a method of operating the magnetron.

TECHNICAL BACKGROUND

A rectangular planar magnetron with a moveable magnet assembly is known from U.S. Pat. No. 4,444,643, esp. FIGS. 10 and 11 thereof, in which the magnetic assembly is translated laterally and parallel to the major axis of the target. Further, DE-A-27 07 144 proposes a magnet assembly which is swept over a rectangular target along a linear path. As explained in U.S. Pat. No. 4,714,536, these known magnet and target assemblies do not provide a substrate with a satisfactorily uniform sputtered coat nor do they provide a satisfactorily uniform erosion of the target. U.S. Pat. No. 4,714,536 proposes that the magnet assembly is moved with a non-repetitive epicycloidal motion combined with a translational motion over the target, i.e. the magnet array performs a non-repetitive small epicycloidal motion distributed over the area of the target. The plasma race-track of this device is not elongated.

A further magnet assembly is known from U.S. 5,188,717 for use with a circular target. The principle is explained in this document that even erosion of the target can be obtained when the dwell time of the magnetic flux remains equal over each unit area of the target. The proposed solution is a specific shape to the magnet assembly, i.e. like a kidney bean, and a combined rotary and translational motion of the magnet assembly. No indication is given of how to adapt this technique to rectangular targets. The kidney bean shape does not produce an elongated plasma race-track and is not suitable for rectangular targets.

U.S. Pat. No. 5,382,344 describes a magnet assembly which produces electron paths in a plurality of race-tracks. The race-tracks are moved linearly and perpendicularly to the longest axis of the target with an oscillatory motion. The target erosion of such a device still shows preferential grooves where the magnetic flux resides for longer time per unit area than in other areas (dwell times).

In one embodiment EP-A-416 241 describes a target in the shape of a ring, whereby the target is more closely fitted to the shape of the stationary race-track. In a second embodiment a magnet array is described which may be moved in an oscillating motion limited by the cathode tray. The motion is produced by a pin on a rotating cam, the pin being journalled in the base of the magnet array. The motion produced is not described.

U.S. Pat. No. 5,328,585 discloses a linear planar magnetron sputtering apparatus with a reciprocating magnet array. The reciprocating motion can be simultaneously lateral and longitudinal with respect to the cathode target. The drive mechanism for moving the magnet array is complex and large in size and requires separate guides for each of the motions. This results in a complex universal joint in one of the drives. The two drives from these motors take up a lot of space and both penetrate the vacuum chamber increasing the complexity of seals between the vacuum chamber and atmosphere and with the cooling circuit. The magnet array is in air which limits cooling of the target. Further, the target is provided with a dark space shield outside the target area as well as strips of titanium material on either side of the silicon target. The motion of the magnet array takes the race-track outside the main target area. By sputtering beyond the target area it is possible to locate the dwell times of the motion of the magnet array outside the target area. Instead of forming grooves in the target the dwell times outside the target result in the race-track either sputtering from the titanium strips or the race-track being extinguished if the motion is so large that the magnet array overlaps the dark space shields. During sputtering, material from the target may be deposited onto the shields resulting in a layer of insulation which can break down locally causing arcing. Alternatively, if the dark space shields are moved further away, titanium is sputtered onto the substrate as a contaminant of the silicon oxide coating.

It is the object of the present invention to provide a moveable magnet array for a sputtering magnetron which is simple in construction, reliable and provides a variety of motions which may be advantageous for planar targets, particularly rectangular targets.

Further, it is an object of the present invention to provide a simple drive mechanism for a planar magnetron and a simple and efficient cooling circuit.

It is a further object of the present invention to provide a magnet assembly which provides a high utilisation of the material of the target at least in a central region thereof.

SUMMARY OF THE INVENTION

The present invention provides a planar magnetron including a surface for mounting a planar substantially polygonal target having a substantially central target area for sputtering onto a substrate, the magnetron comprising: an array of magnets defining a closed loop magnetic field for generating an elongated plasma race-track above the target, means for establishing cyclical, relative, substantially translational movement between the race-track and the surface, the substantially translational movement being substantially parallel to the surface, the trace of the substantially translational movement being a two-dimensional figure and the periphery of the race-track lying substantially within the substantially central target area during each cycle, the establishing means being adapted to provide a substantially uniform erosion of the target at least within the substantially central target area. The figure is preferably generally hypotrochoidal or epitrochoidal in form. The target is preferably substantially rectangular. The present invention also provides a planar magnetron having at least a surface for mounting a planar target comprising: an array of magnets defining a closed loop magnetic field for generating a plasma race-track above the target, means for establishing repetitive, relative, substantially translational movement between the race-track and the surface, the substantially translational movement being parallel to the surface and being in the form of a two-dimensional figure, the figure being generally epitrochoidal or hypotrochoidal in form.

In the magnetrons in accordance with the present invention described above the magnet array may be an array of permanent magnets or an electromagnet or electromagnets which move to create the race-track movement defined above. Alternatively, an array of stationary electromagnets may be used and the movement of the race-track may be produced by varying the magnitude and relative phases of the currents among the electromagnets of the array.

The present invention also includes a method of operating a planar magnetron having at least a surface for mounting a planar target and an array of magnets defining a closed loop magnetic field, comprising the steps of:

generating a plasma race-track above the target; and moving the plasma race-track relative to the surface, the movement being repetitive, substantially translational and parallel to the surface and the trace of the movement being a two-dimensional figure having a generally hypotrochoidal or epitrochoidal form.

The present invention also provides a method of operating planar magnetron including a surface for mounting a planar substantially polygonal target having a substantially central target area for sputtering onto a substrate, and an array of magnets defining a closed loop magnetic field for generating an elongated plasma race-track above the target, comprising the steps of: establishing cyclical, relative, substantially translational movement between the race-track and the surface, the substantially translational movement being substantially parallel to the surface, the trace of the movement being a two-dimensional figure and the periphery of the race-track lying substantially within the substantially central target area during each cycle, so that at least the substantially central target area is substantially uniformly eroded.

The present invention may provide the advantages of good utilisation of target materials while still providing a mechanically simple and reliable magnet assembly and drive. Particularly, the inventive movement of the magnet assembly may be produced with an assembly which requires only a main drive and a dependent drive thus making the assembly simple and interchangeable with existing rotating cathode magnetron assemblies. The present inventor has determined that the known motions of the magnetic arrays require complex drive arrangements and are not ideal for all types of planar magnetron target shapes, particularly rectangular targets.

The dependent claims define further embodiments of the present invention. The present invention, its advantages and embodiments will now be described with reference to the following drawings.

DESCRIPTION OF THE ILLUSTRATIVE EMBODIMENTS

The present invention will be described with respect to particular embodiments and with reference to certain drawings but the invention is not limited thereto buy only by the claims. The drawings described are only schematic and are non-limiting.

The present inventor has determined surprisingly that certain advantages can be obtained in a planar sputtering magnetron with a rectangular target when the motion of the magnet assembly is repetitive rather than non-repetitive. Non-repetitive motions are supposed to distribute the erosion uniformly over the target area. However, in accordance with the present invention, substantially uniform erosion of the target can be obtained by repetitive, i.e. reentrant, motions in which the same part of the target is eroded at the same time within any cycle of the motion.

In accordance with the present invention complex motions may be produced by a simple single drive mechanism which involves simple moving parts and requires a minimum of feed-throughs into the vacuum chamber. The present invention also provides a planar magnetron arrangement which can be fixed to the same bases or end pieces which can be used for a rotating cathode magnetron. Hence, the planar magnetron according to the present invention provides a surprisingly uniform erosion of the target combined with surprising flexibility in that it can be interchanged with a rotating cathode magnetron assembly. The present inventor has determined that motions which may be generally described as reentrant epitrochoidal, epicycloidal, hypotrochoidal or hypocycloidal, provide useful uniformity of target erosion for planar magnetron targets having a generally polygonal, particularly rectangular form, e.g. square, oblong or parallelogram shape while also providing the capability of adjusting the motion to optimise the erosion profile depending upon the exact shape of the target.

Figure 1A:
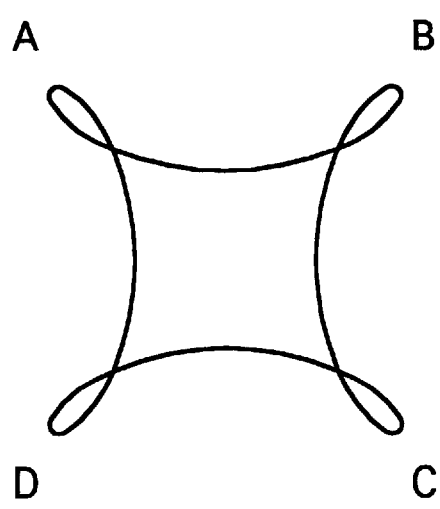
FIGS. 1a to 1d show schematic representations of movements in accordance with the present invention.
Figure 1B:
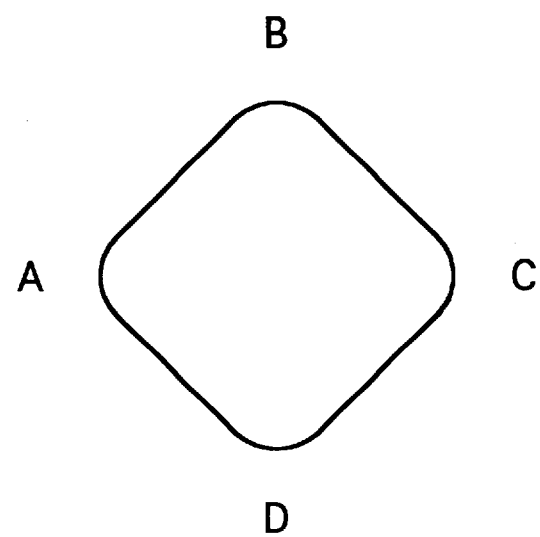
Figure 1C:
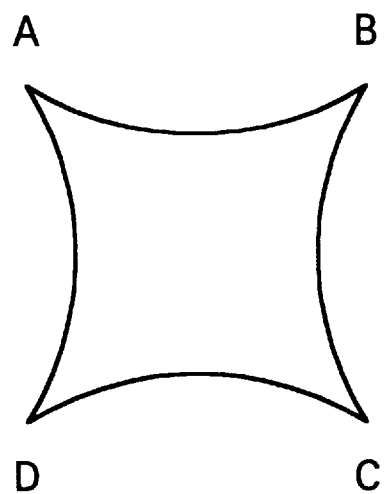
Figure 1D:
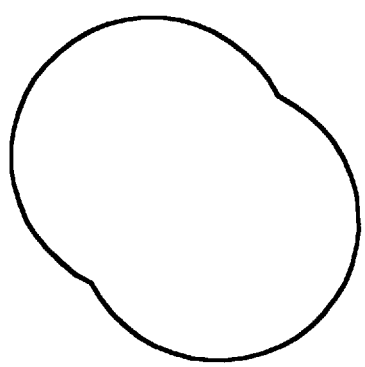
Figure 2A:
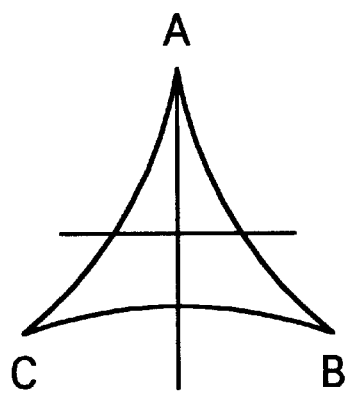
FIGS. 2a to 2d shows further schematic representations of movements in accordance with the present invention.
Figure 2B:
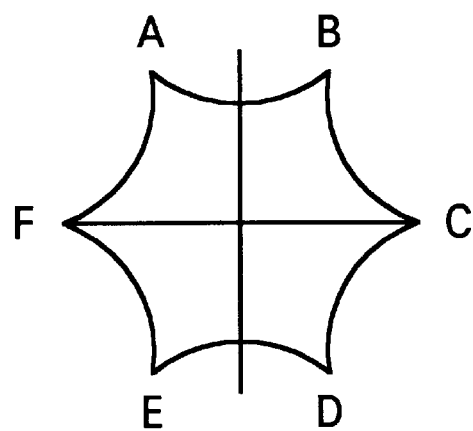
Figure 2C:
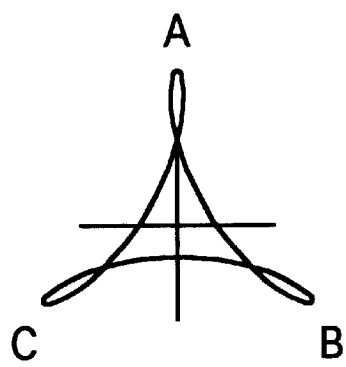
Figure 2D:
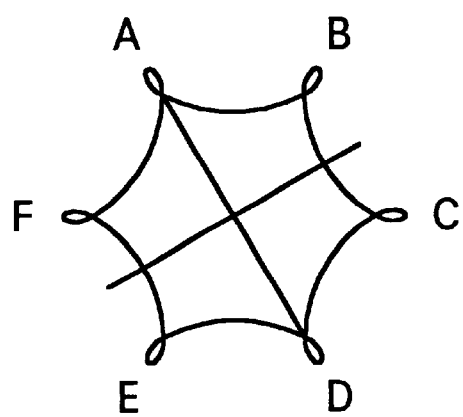

The translational motion of the magnet assembly in accordance with the present invention may be generated by a complex cycloidal movement described by the reentrant trace of a non-slipping movement of a point on a first circle (or perturbation of a circle such as an ellipse, an oval or an egg shape) on the outer or inner periphery of a second circle (or perturbation of a circle such as an ellipse, an oval or an egg shape). Where both generators are circles, epitrochoidal or hypotrochoidal motions may be produced, of which epicycloidal or hypocycloidal motions are specific subclasses of these. Suitable non-limiting motions are shown in FIGS. 1a to 1d for a rectangular or square target. In accordance with one embodiment of the present invention, for a target with n sides, the motion of the magnet assembly may have n cusps or corners or a factor of n. A cusp is defined by a discontinuity in the tangent to the curve. Each trace shown in FIGS. 1a to 1c has four cusps corners A, B, C, D, however the invention is not limited thereto. For instance, FIG. 1d shows a suitable epicycloidal motion in accordance with the present invention, a nephroid, which has only two positions which may be described as cusps or corners. Suitable hypotrochoidal motions for a triangular or hexagonal target are shown in FIGS. 2a to 2d as non-limiting examples. Each of these has either three cusps, A, B, C or six cusps A–F but the invention is not limited thereto. All the figures shown in FIGS. 1a to 1d and 2a to 2d are repetitive or cyclical, i.e. the trace is reentrant at the end of each cycle. The present invention includes within its scope translational relative motion of the magnet assembly with respect to the target which has the form of a two-dimensional figure. This figure may approximate epitrochoidal or hypotrochoidal motion and may be generated by other means (e.g. a computer controlled robot) than by mechanical means adapted to trace the locus of a point on a circle rolling within slipping on another circle. Such equivalent approximate forms will be described in this application and in the claims as "generally hypotrochoidal in form" or "generally epitrochoidal in form".

An epitrochoid or a hypotrochoid may be defined by three dimensions: a, b, h where b is the radius of a first circle which rolls without slipping around the outside (epitrochoid) or around the inside (hypotrochoid) of a second circle with the radius a. The dimension h is the distance from the centre of the first circle to the tracing point. If b=h, an epicycloid or a hypocycloid is generated. In FIG. 1a to 1c, respectively, the figures were generated using a circle rolling on a circle. The shown hypotrochoids are generated by ratios of dimensions a:b:h as follows: FIG. 1a, 1:¾:⁷⁄₁₃; FIG. 1b, 1:¾:³⁰⁄₁₃; FIG. 1c, 1:¼:¼. The epicycloid of FIG. 1d has the ratios: 1:½:½. In accordance with the present invention, ovals ellipses, egg shapes or any other form of perturbation of a circle may be used as the generators of the translational figure determining the motion of the magnet assembly. Such modified or perturbed figures will be referred to in this application and in the appended claims as "generally hypotrochoidal in form" or "generally epitrochoidal in form".

Figure 3A:
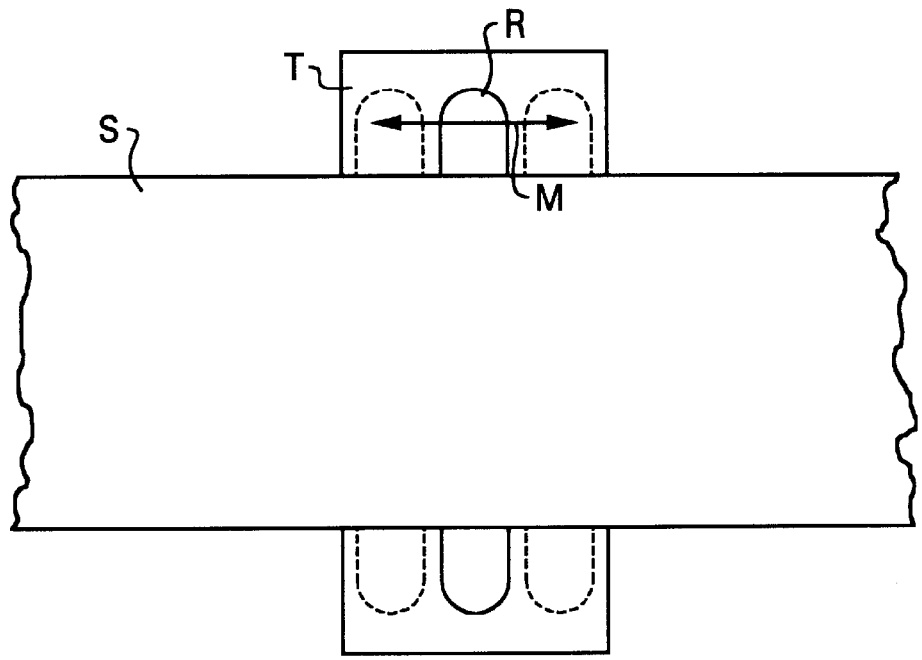
FIGS. 3a and 3b are schematic top views of target arrangements with associated moving magnet assemblies in accordance with the present invention.

A further aspect of the present invention is that the preferred race-track motions do not move the sputtering parts of the race-track substantially over and beyond the edges of the target, at least in a substantially central region of the target where the substrate lies over the target. Keeping the race-track within the confines of the target in those parts of the target which are covered by the substrate avoids sputtering material from outside the target onto the substrate. Allowing sputtering outside the target places limitations on the materials which can be used flanking the target. One aspect of the present invention is directed to avoiding any such limitations or reducing their importance by keeping the race-track substantially within the target area at least in a central region of the target which lies under the substrate. This will be explained with reference to FIGS. 3a and 3b. In FIG. 3a a race-track R is created by a magnet array (not shown) above a target T. A substrate S is located above the target T and may be stationary or may be a sheet which moves continuously from left to right. The Motion M of the race-track generated in accordance with the present invention by relative motion between the race-track and the target is confined in accordance with the present invention within the target area at least in those parts of the target which are overlapped by the substrate S. In areas where there is no overlap, e.g. the area at the ends of the target, the race-track may move beyond the target as sputtering outside the target in these areas does not have a seriously detrimental effect (not shown in FIG. 3).

Figure 3B:
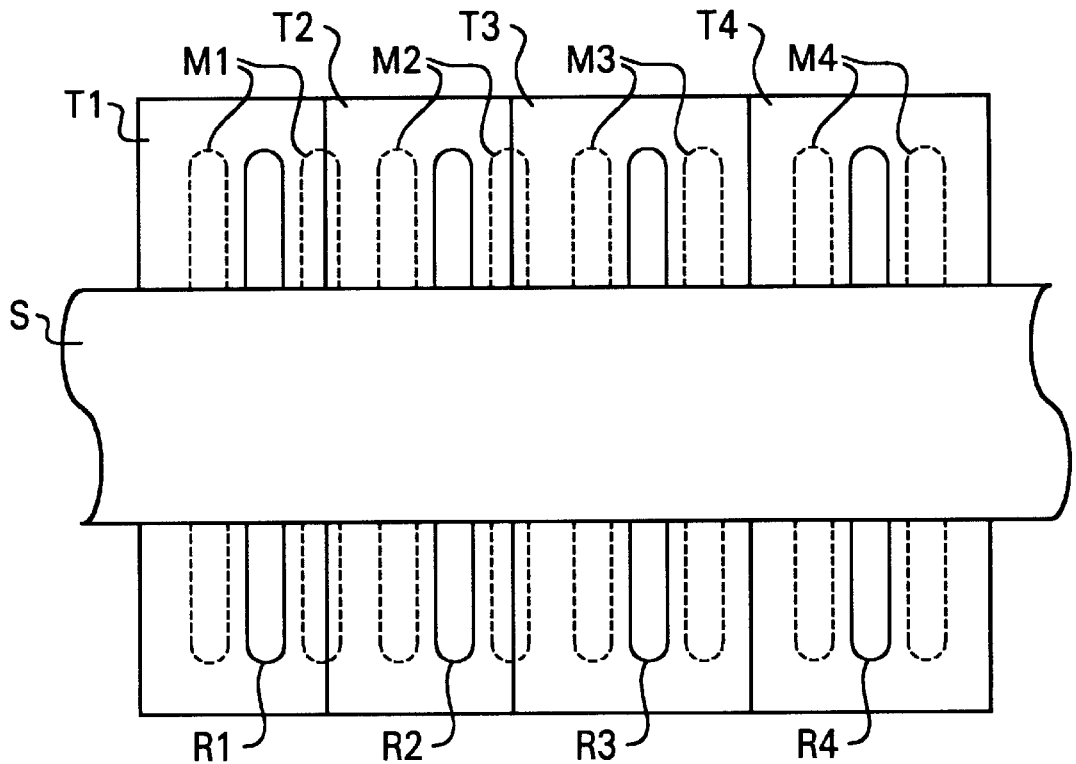

With reference to FIG. 3b, the present invention includes a plurality of targets next to each other, e.g. $T_1$ to $T_4$. Each target $T_N$ has its own race-track $R_N$ each generated by a separate magnet array. Each race-track $R_N$ may move independently. In accordance with the present invention the target means the contiguous area of material to be sputtered, i.e. in the present case the complete area of the targets $T_1$ to $T_4$ and not just an individual target. Accordingly, the race-tracks $R_1$ to $R_4$ may not substantially move outside the complete target area $T_1$ to $T_4$ where this is overlapped by the substrate S. However, in accordance with the present invention individual race-tracks $R_1$ to $R_4$ may move beyond the area of an individual target portion $T_1$ to $T_4$ as shown for the targets $T_1/T_2$ and $T_2/T_3$. Hence, in accordance with the present invention, it is the periphery of the complete target area which is important in determining the limits of movement of a race-track.

Figure 4:
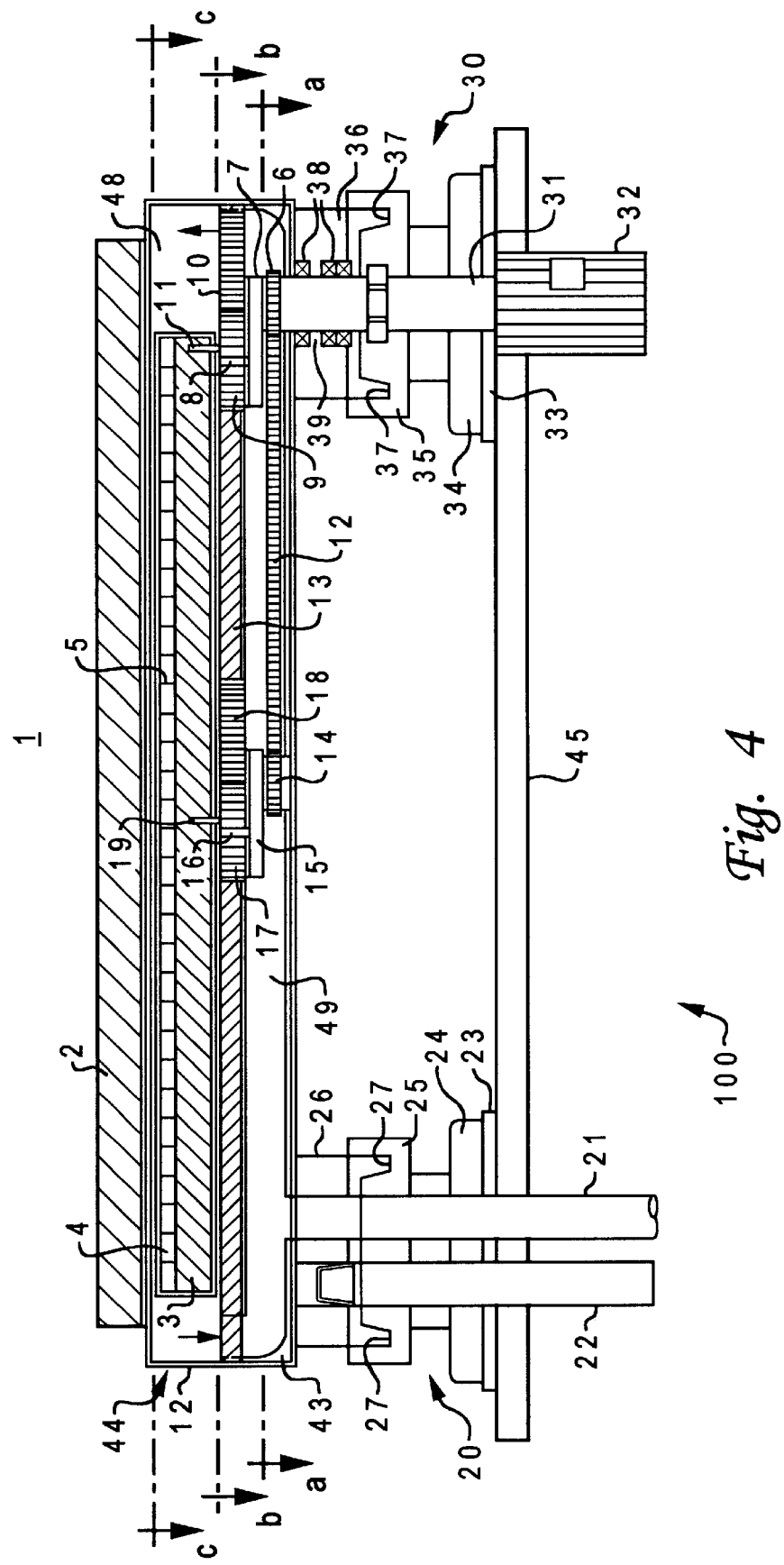
FIG. 4 shows a schematic representation of a cross-sectional side view of a magnet assembly in accordance with the present invention.

An embodiment of the present invention will be described with reference to FIGS. 4 to 7. FIG. 4 is a schematic longitudinal cross-sectional side view of a part of the planar magnetron sputtering device 100 in accordance with the present invention. A vacuum space indicated generally at 1 is defined by a vacuum chamber of which only the lower single vacuum wall 45 is shown. Within the vacuum space 1 an inert gas such as argon may be introduced when sputtering metals, or a mixture of an inert and a reactive gas such as argon and oxygen may be introduced when sputtering compounds such as oxides or nitrides reactively. A planar target 2 is arranged to be supported on a main housing 44 parallel to a magnet assembly 4 which will be described later. Magnet assembly 4 is located in a movable housing 5 having a base 3 which is driven in a complex motion by pins 11 and 19, i.e. in this embodiment the motion is generally hypotrochoidal in form and lies in a plane parallel to the target 2. Base 3 is preferably a thick section soft magnetic material which acts as a keeper for the magnets of magnet array 4 and improves the magnetic circuit formed by the magnet array 4, the base 3 and the air gap between the magnets of the magnet array 4.

Main housing 44 is supported by an end base 20, 30 at each end. End base 20 includes feed-throughs 21, 29, and 22 (29 is not visible in FIG. 4, best shown in FIG. 5) which provide a cooling fluid inlet 21, a cooling fluid outlet 29 and a high voltage feed-through 22 respectively. End base 30 includes a feed-through 31 which provides rotational driving power from a motor 32 to the pins 8 and 16 through a series of gears 9, 10; 17, 18 and via a timing belt 12 or similar. The driving power for 31 may be provided by an electric, pneumatic or hydraulic motor 32 or any other suitable rotational driving means. It is particularly preferred in accordance with the present invention if the feed-throughs 21, 22, 29, 31 are generally of the type known from the end blocks of commercially available rotating cathode magnetrons.

End bases 20, 30 include upper an lower sealing units 26, 25; 36, 35 respectively which include at least one "O"-ring seal 27; 37 therebetween. Drive feed-through 31 includes a plurality of rotating seals 38 for sealing against leakage of cooling liquid from main housing 44. A leak detection pipe 39 may be provided between two of the seals 38 in order to warn of an impending major leak. End bases 20, 30 also include an insulating plate 23, 33 respectively to provide electrical isolation between the vacuum chamber wall 45 and the main housing 44. The high voltage feed-through includes a central conductor and outer insulation and provides electrical power to main housing 44 through a bushing 28.

Figure 5:
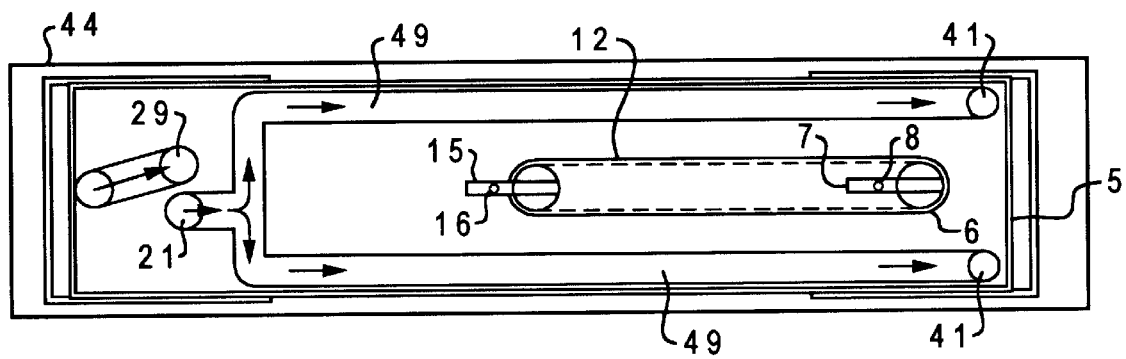
FIGS. 5 to 7 show further schematic representations of cross-sectional top views at different depths (levels a, b, c in FIG. 4) of a magnet assembly housing in accordance with the present invention.
Figure 6:
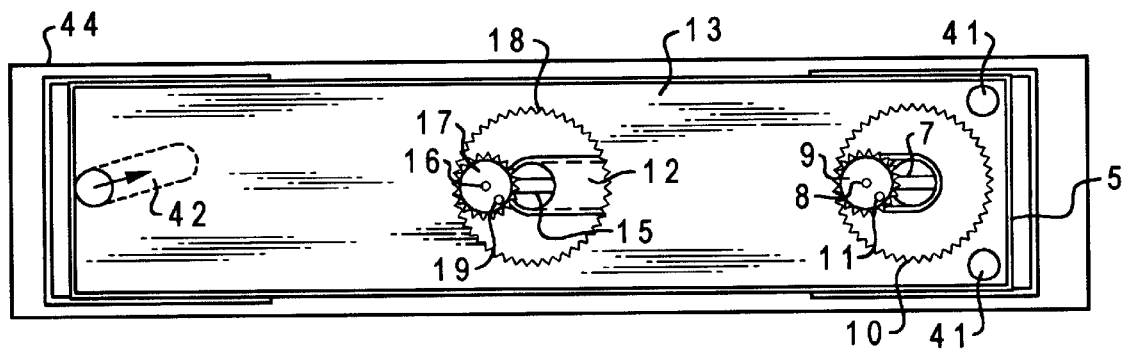
Figure 7:
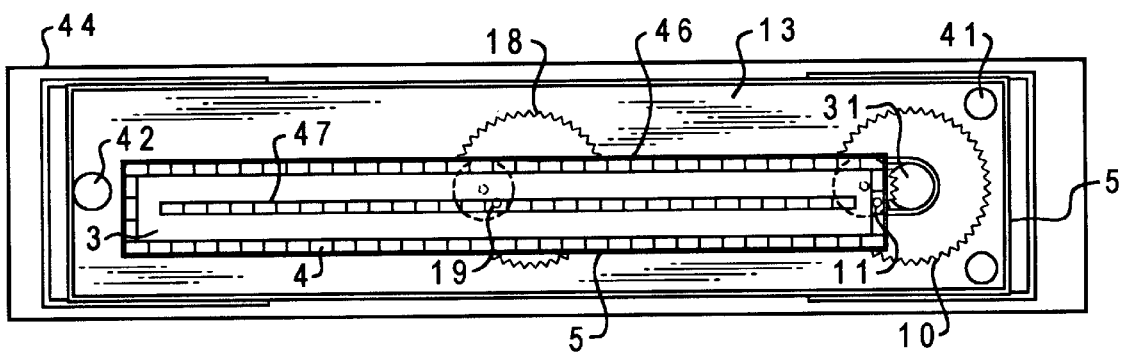

FIGS. 5 to 7 show various cross-sectional top-views at different depths of the main housing 44. FIG. 7 shows a general view from the top according to section c—c in FIG. 4. FIG. 6 shows a cross-section just above the plate 13 according to the section b—b in FIG. 4. FIG. 5 is a cross-sectional top view from just below the plate 13 according to the section a—a in FIG. 4. The magnet assembly 4 is located in the moveable housing 5 and is therefore generally protected from the cooling fluid. Magnet array 4 is preferably an elongate array which includes a central, relatively linear array 47 of high powered magnets, each magnet having one pole pointing vertically, e.g. the north pole. In accordance with the present invention the housing 5 protects the magnet array 4 from the cooling liquid so that both corroding and non-corroding magnet types may be used. Suitable magnets are, for instance, high energy NdFeB magnets. Arranged around the inner array 47 is closed loop 46 of similar high powered magnets, each of which has the opposite pole from the inner array 47 pointing upwards, e.g. the south poles. The magnets of the inner array 47 and the closed loop 46 may be a series of discrete magnets arranged in a line. The magnetic field generated between the magnets 46, 47 combined with the crossed electrostatic field around the target 2 creates a plasma loop usually known as a "race-track" immediately above the target 2. Located below the housing 4 is a fixed plate 13. In fixed plate 13, a central (18) and an end internal circular gear 10 are machined through plate 13. Internal gears 10, 18 may have different average radii but it is preferred in accordance with the present invention if both the radii "a" of internal gears 10, 18 are the same. Internal circular gears 10, 18 also have shapes which are perturbations of a circle, e.g. an ellipse, an oval, an egg shape or similar. Preferably, the internal gears 10, 18 are removable from plate 13 so that they may be interchanged with others having a different shape and/or radius and/or number of teeth. Internal gears 10, 18 may be located in inserts which fit into plate 13.

Within inner gears 10, 18, interchangeable cogs 9, 17 are constrained to move around the inner periphery thereof, supported on pins 8, 16 respectively. Cogs 9, 17 may optionally have different radii but it is preferred in accordance with the present invention if the radii "b" of the cogs 9 and 17 are the same. Pins 8, 16 are driven around inside the inner gears 10, 18 by eccentrics 7, 15 respectively. Eccentric 7 is driven directly from the feed-through 31, whereas eccentric 15 is driven by a timing belt 12 or similar between gear 6 of feed-through 31 and gear 14 attached to eccentric 15. By setting the number of teeth on gears 6 and 14 and the position of the timing belt 12, the rotational speed and phase of eccentric 15 may be set to be the same or different from the rotational speed and phase of eccentric 7. It is preferred in accordance with the present invention if the rotational speeds and phases of eccentrics 7 and 15 are the same. Movements of the magnet array 4 are then similar at the ends and in the middle thereof. Preferably, the shafts carrying gears 6 and 14 are securely journalled in the base of main housing 44 in such a way that they can be removed and replaced with other gears having a different diameter and/or a different number of teeth and/or a different shape.

Located on cogs 9 and 17 are drive pins 11, 19 respectively which are located in passing holes in the base 3 and drive the movable housing 5. Drive pins 11, 19 may be fixed within the circumference of cogs 9 and 17 respectively (the dimension "h" from the centre of cogs 9, 17 to the centre of drive pins 11, 19 respectively is then less than or equal to "b") or beyond the circumference on an extension (not shown, dimension "h" then being greater than "b"). As shown the housing 5 is cantilevered on the two pins 11, 19. In accordance with the present invention slide blocks (not shown) may be provided to support the weight of the housing 5 and to eliminate the bending moment on pins 11 and 19 caused by the cantilever. Such slide blocks may, for instance, have a low frictional PTFE surface. These blocks do not need to provide any guiding function according to the present invention.

The cooling fluid, e.g. water, is pumped into the main housing through feed-through 21 and flows along two or more channels 49 towards the remote end of main housing 44, flows upwards through openings 41 in fixed plate 13 to an area 48 above and around the housing 5, returns to the other end of housing 44 and exits via the hole 42 in plate 13 and the feed-through outlet 29. While flowing back towards outlet 29, the cooling fluid floods the upper part 48 of the housing 44 and is in good contact with the underside of the support of target 2, thus providing efficient cooling of the target 2. One aspect of the present invention is to split the main housing 44 into an upper (48) and lower (43) chamber separated by the plate 13. Preferably, the drives for the magnet array 4, i.e. the movement generators, are located in the lower chamber 43 and the magnet array 4 itself is located only in the upper chamber 48 so that the fluid flow in the upper chamber 48 is impeded only by the magnet array 4. Water may enter both the lower and upper chambers 43, resp. 48.

Alternative methods of producing relative motion between the magnet array 4 and the target 2 are included within the present invention. For instance, instead of cogs 9, 17 following inside of internal gears 10, 18, and cogs 9, 17 may be arranged to engage with the outside of external gears located in the same position as internal gears 10, 18 and journalled on shafts secured in plate 13. Pins 11, 19 then give the magnet array 4 an epitrochoidal or epicycloidal motion.

Figure 8:
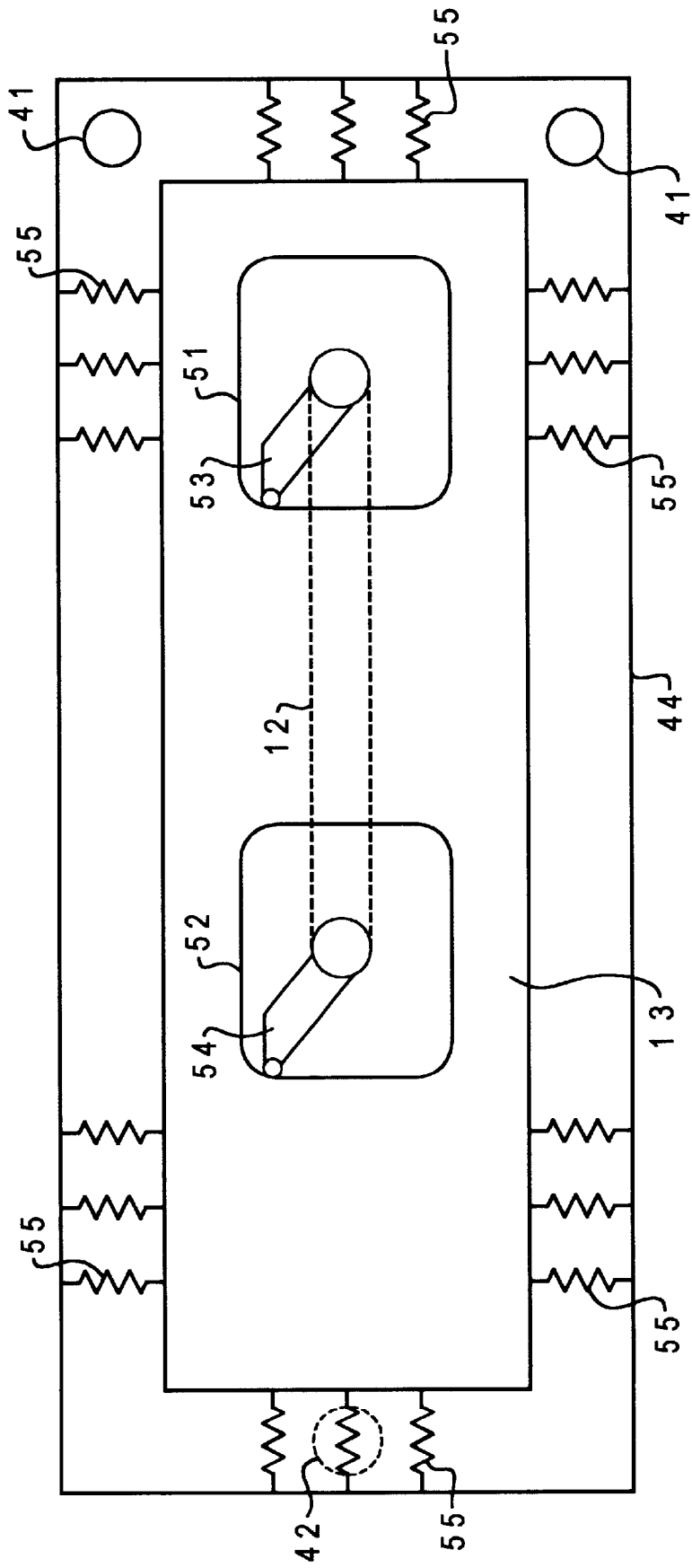
FIG. 8 shows a schematic representation of a top view of the base of the magnet array housing in accordance with a further embodiment of the present invention.

Some motions generally hypotrochoidal or epitrochoidal in form can also be formed by arrangements which do not involve a circle rolling about another circle. FIG. 8 shows such an arrangement which is a less preferred embodiment. FIG. 8 is a highly schematised representation of a top view of the base 3 of the housing 5. Plate 13 lies below the base of housing 5. Instead of internal gears 10, 18, specially shaped holes 51, 52 are provided in the base 3 of housing 5 which act as cams. The shape of the holes 51, 52 in FIG. 8 is only schematic and does not necessarily represent the actual shape of the holes as used. The hole shape is designed to give the magnet array an approximately hypocycloidal or epicycloidal motion. The magnet array 4 is secured to the base 3 of housing 5 and moves with it. The cam followers 53, 54 are made to rotate in synchronism by the motor 31 via gears 14 and 16 and timing belt 12 all of which lie in the lower part of housing 44 below the fixed plate 13. The cam followers 53, 54 are maintained in contact with the inside surface of the shaped holes 51, 52 by means of springs 54 and/or sliding guides which are secured at one ends thereof to the base 3 of housing 5 and at the other ends thereof to the housing 44. The springs 54 centralise housing 5 in housing 44. The shape of the holes 51, 52 is preferably not circular. In accordance with the present invention the shape is preferably one which produces a motion whose trace is more complex, e.g. similar to that of FIG. 1b or 1d. Instead of holes 51, 52, specially shaped grooves my be arranged in base 3 in which rollers or pins attached to the cam followers 53, 54 may move. Other details are as in FIGS. 4–7.

Figure 9A:
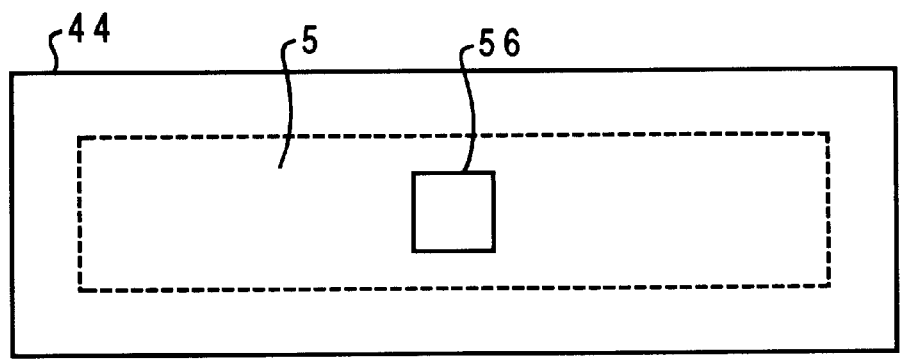
FIGS. 9a to 9c show schematic representations of master and dependent drive means in accordance with the present invention.
Figure 9B:
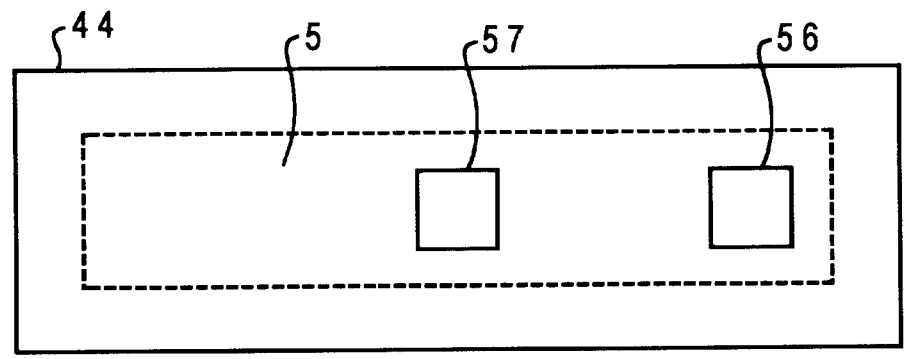
Figure 9C:
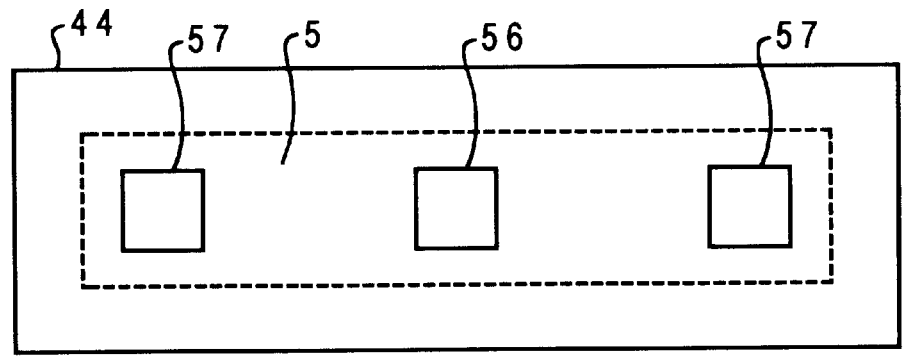

Some aspects of the drive mechanisms of the present invention will now be described. With reference to FIGS. 4 to 8, apparatuses has been described for generating a relative motion between the magnet array 3 and the target 2. These apparatuses have in common that they include a master drive and a dependent drive means, whereby the dependent drive means does not penetrate the vacuum chamber. With reference to FIG. 4, the master drive means is provided by the complex 31, 7–11 and the dependent drive means by the complex 14–19. The invention is not limited thereto. The magnet array may be driven by a single master drive means 56 which may be, for instance, located in the centre of thereof, see for example FIG. 9a. A disadvantage of the system shown schematically in FIG. 9a as well as the system shown schematically in FIG. 8 is that the magnet array 4 must be guided or elastically held in order for the drive mechanism 56 to move the magnet array 4 consistently. It is preferred in accordance with the present invention, if the drive mechanisms and the magnet array 4 are self-guided, i.e. that the magnet array requires no springs or guides to produce the required motion. Such a self-guided mechanism is shown in FIGS. 4–7. In this preferred embodiment of the invention, no guides or springs are required to guide the magnet array 4. Instead the magnet array 4 in its housing 5 is supported in a two-point manner by the pins 11 and 19. Stability is provided by the arrangement of a dependent drive means 57 offset from a master drive means 56 as shown schematically in FIG. 9b. In this embodiment the master drive means 56 is place at one end and the dependent drive means 57 is placed roughly in the centre of the housing 44. The invention is not limited thereto and includes placing both master and dependent drive means 56, 57 at opposite remote ends of the housing 44 or in placing the master drive means 56 towards the centre and the dependent drive means 57 towards one end. The present invention also includes using more than one dependent drive means 57 coupled to a master drive means 56, e.g. as shown schematically in FIG. 9c, in which a central master drive means 56 is linked to two remote dependent drive means 57 via two separate timing belts.

In accordance with the present invention the motion generators which are associated with each of the master and dependent drive means 55, 56 are independent of each other. A first motion generator in FIG. 4 comprises the inner gear 10, the cog 9 and the pin 11 which is independent of the motion generator comprising the inner gear 18, cog 17 and pin 19. However, the distances between the two pins 11 and 19 preferably remains the same otherwise the driving mechanisms will jam. In general it is preferred if both motion generators provide the same motion.

Figure 10B:
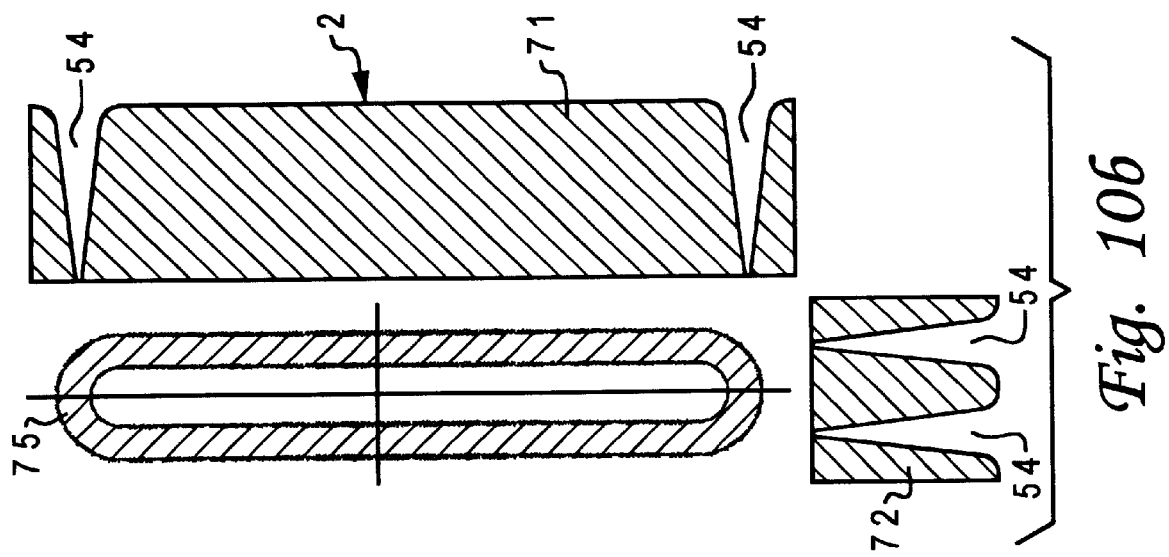
FIGS. 10a and 10b show the form of a conventional stationary race-track for a rectangular target and the resulting erosion groove.
Figure 10A:
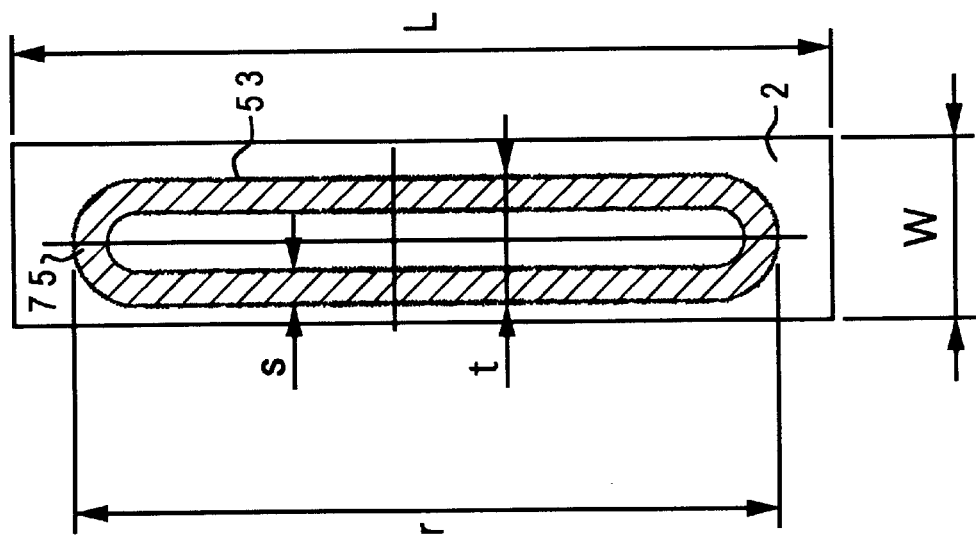

In the following a non-exhaustive list of exemplary magnet array movements in accordance with the present invention will be described. A comparative example of a conventional plasma race-track 75 is shown in FIG. 10a as it is formed on a target 2. The length "l" and width "w" of the target are 450 mm and 110 mm. The width "s" of the track of the race-track is defined as the distance in which 95% of the energy of the race-track is concentrated. In this example it is 10 mm. The distance "t" across the minor axis of the race-track between the centres of the tracks is 55 mm and the length "r" of the major axis of the race-track is 400 mm. With a race-track stationary with respect to the target 2, erosion of the target only occurs under the race-track. The deep groove 54 formed all around the target having the same form as the race-track results in poor target consumption, i.e. the percentage of material used before the target 2 must be replaced. In the above example this consumption lies typically between 20 to 30%. Typical longitudinal and lateral cross-sections 71 and 72 through the target are shown in FIG. 10b. It can be seen that the erosion 54 of the target at the centres of the race-track and along its length is very high requiring replacement of the target well before most of the material has been used up. As the race-track is stationary and well within the size of the target, the plasma at no time goes beyond the confines of the target. Hence, there was no sputtering of material from the parts of the planar magnetron adjacent the target.

In accordance with the present invention at least a central portion of the target 2 can be sputtered with a substantially uniform erosion profile. Increased erosion at the ends of a long rectangular target 2 does not exclude a particular arrangement from the present invention because it is possible to use replaceable end pieces to the target 2. These end pieces are possibly eroded with a poor average yield but the average erosion of the complete target may still be higher than conventional designs. Within the central portion of the target, e.g. that portion which is covered by the substrate to be sputtered, the uniformity of erosion profile in accordance with the present invention may be represented by the ratio of the average erosion to the peak erosion. For perfectly uniform erosion this ratio would be 100%. If the peak erosion within the central region is 100% the target is eroded completely through. If the peak erosion in the central region is Y % and the average erosion in the central region is X%, then the uniformity ratio in accordance with the present invention is X/Y×100%. For the above practical example of a stationary target shown in FIG. 10, the uniformity ratio of the central portion of target 2 is 20–30%. In accordance with the present invention the uniformity ratio in the central portion of the target 2 is preferably over 50%, more preferably over 55%, and most preferably over 60%. Values for the uniformity ratio in excess of 65% or 70% can be achieved in accordance with the present invention.

Figure 11:
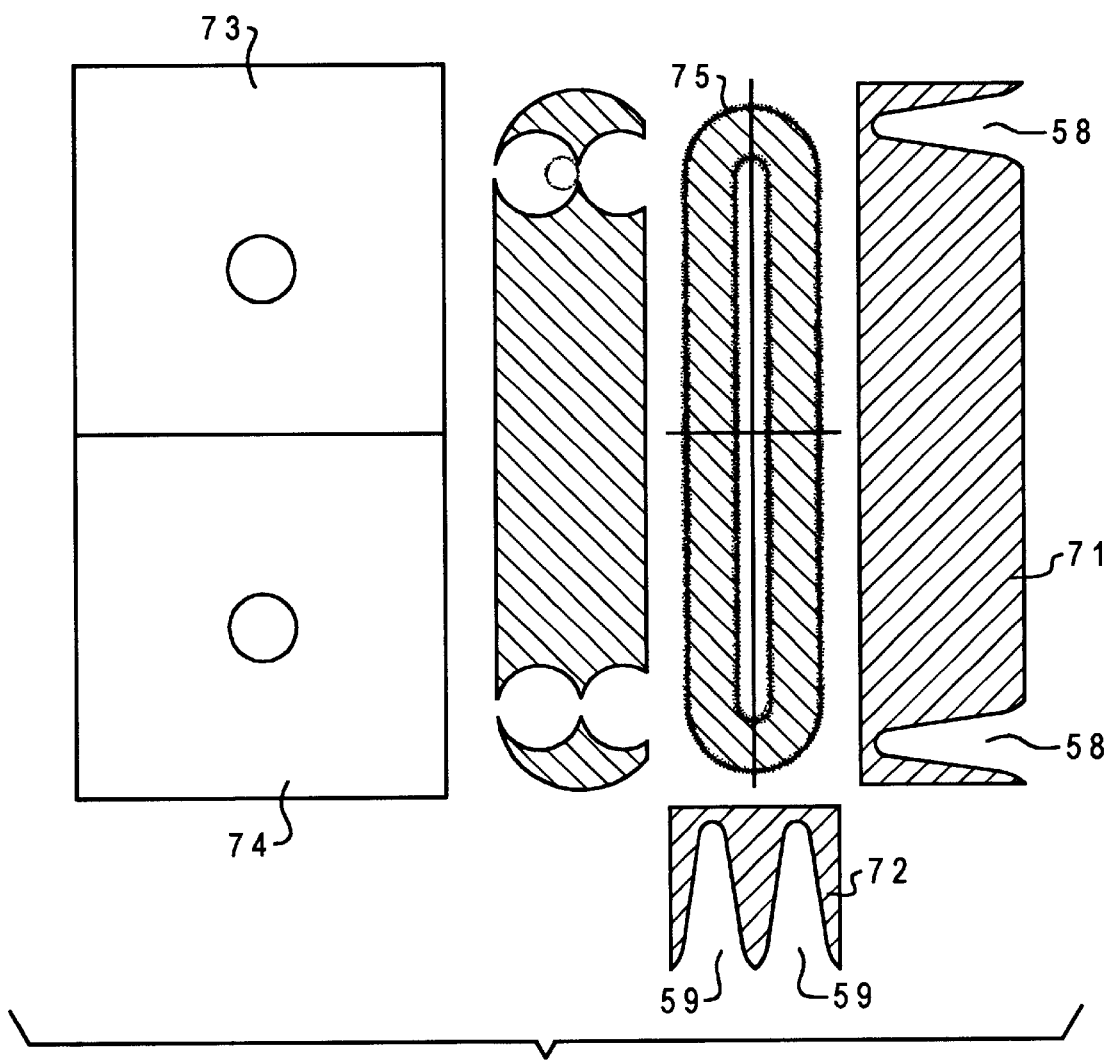
FIG. 11 shows a circular motion and the resulting target erosion profiles parallel and perpendicular to the major axis of the race-track.

An example of a circular motion of the magnet array 4 is shown in FIG. 11. The motion is a circle as shown at 73 and 74. The average target consumption for the complete target was about 33%. The target erosion profiles parallel (58) and perpendicular (59) to the main axis of the race-track and at the centres thereof, respectively are shown in sections 71 and 72 respectively. The uniformity ratio of the central portion is about 49%. A pictorial view of the depth of erosion (depending upon grey scale) is shown at 75. Two deep erosion grooves 58 are noticeable at each end of the race-track and also (59) in the central region perpendicular to the long axis of the race-track.

Figure 12:
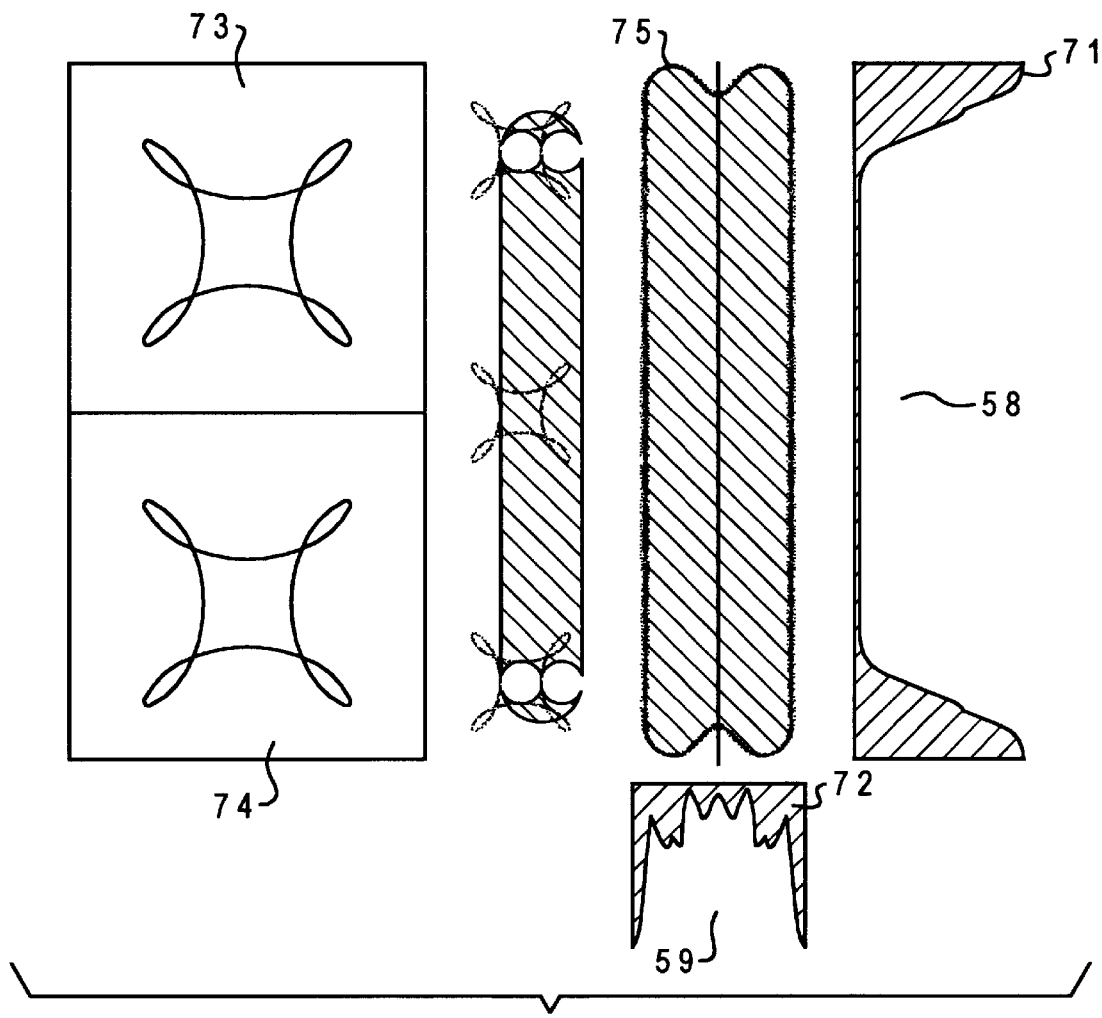
FIG. 12 shows a preferred movement of the magnet assembly in accordance with the present invention and the resulting target erosion profiles parallel and perpendicular to the major axis of the race-track.

In accordance with an embodiment of the present invention, an elongate race-track was given the motion as shown in FIG. 12. This was produced by a planar magnetron in accordance with the present invention with the movement of the magnet array produced by the device shown schematically in FIGS. 4–7. The movement was hypotrochoidal with the dimensions "a"=1, "b"=¼ and "h"=⅖. The race-track dimensions were r=365 mm, s=14 mm, t=25 mm, l=450 mm, and w=110 mm. The sideways movement of the magnet array, i.e. perpendicular to the longitudinal axis of the race-track, was 268% of the dimension "t". The target consumption over the long central portion of the target was about 70%. Some sputtering outside the target was encountered but this was minimal (~0.1%). The target erosion profiles 58, 59 parallel and perpendicular to the main axis of the race-track and at the centres thereof, respectively, are represented in sections 71 and 72 respectively. The erosion profile 58 shows good uniformity over most of the length of the race-track and the erosion profile 59 perpendicular to the long axis of the race-track is also much more uniform than that of FIGS. 10 or 11. The motion of the master motion generator 56 is given at 73 and for the dependent motion generator 57 at 74. A pictorial view of the depth of erosion (depending upon grey scale) is given at 75.

Figure 13:
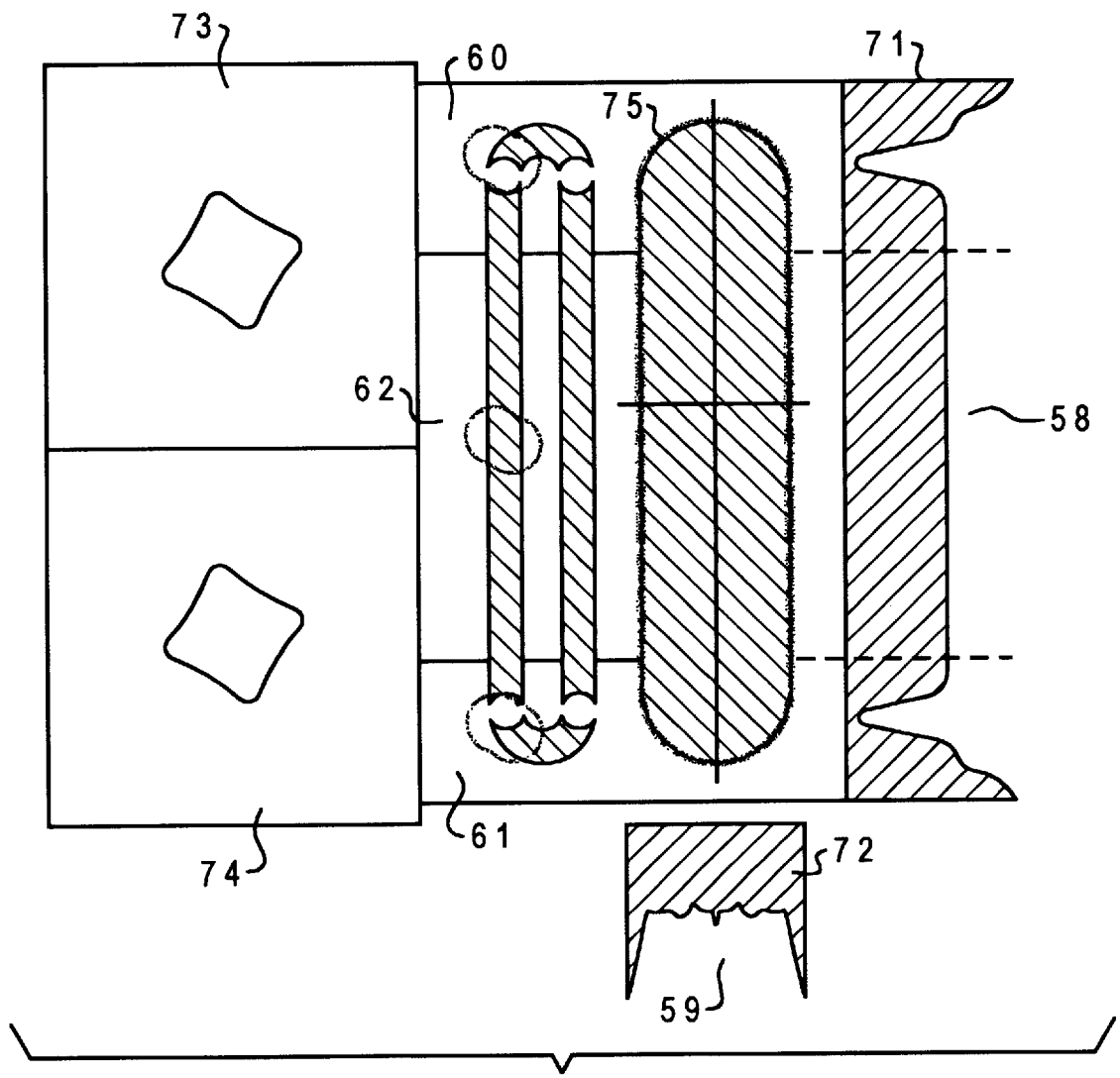
FIG. 13 shows a further preferred movement of the magnet assembly in accordance with the present invention and the resulting target erosion profiles parallel and perpendicular to the major axis of the race-track.

A further embodiment of a suitable motion in accordance with the present invention is shown in FIG. 13. This was produced by a planar magnetron in accordance with the present invention with the movement of the magnet array produced by the device shown schematically in FIGS. 4–7. The movement was hypotrochoidal with the dimensions "a"=1, "b"=¼ and "h"=⅛. The race-track dimensions were r=372, s=14, t=48, l=450, w=110. The sideways movement of the magnet array, i.e. perpendicular to the longitudinal axis of the race-track, was 88% of the dimension "t". The motion is a modified square which is tilted with respect to the axis of the target. The target consumption over the relatively long central portion of the target was just under 50% with an average for the complete target of about 38%. The uniformity ratio of the central portion was over 80%. No sputtering outside the target was encountered. The target erosion profiles 58, 59 parallel and perpendicular to the main axis of the race-track at the centres thereof, respectively are represented in sections 71 and 72 respectively. The motion of the master motion generator 56 is given at 73 and for the dependent generator 57 at 74. A pictorial view of the depth of erosion (depending upon grey scale) is given at 75. Two peaks of erosion are noticeable at each end of the race-track. In the middle of the target the erosion is extremely uniform.

Extremely high target consumptions are possible with this motion if replaceable end portions for the target are used. In accordance with the present invention two separate replaceable portions 60, 61 of the target material are located at the ends of the target in positions in which these replaceable portions 60, 61 experience the peak erosions visible in section 71 of FIG. 13. When the end portions 60, 61 are used up, these are replaced while maintaining the middle portion 62, which need only be replaced after approximately two end portions have been replaced. Target consumption for the middle portion 62 of over 80% can be achieved by this procedure. For long targets, the poor consumption of the end pieces 60, 61 of the target has little effect on the overall target utilisation.

Figure 14:
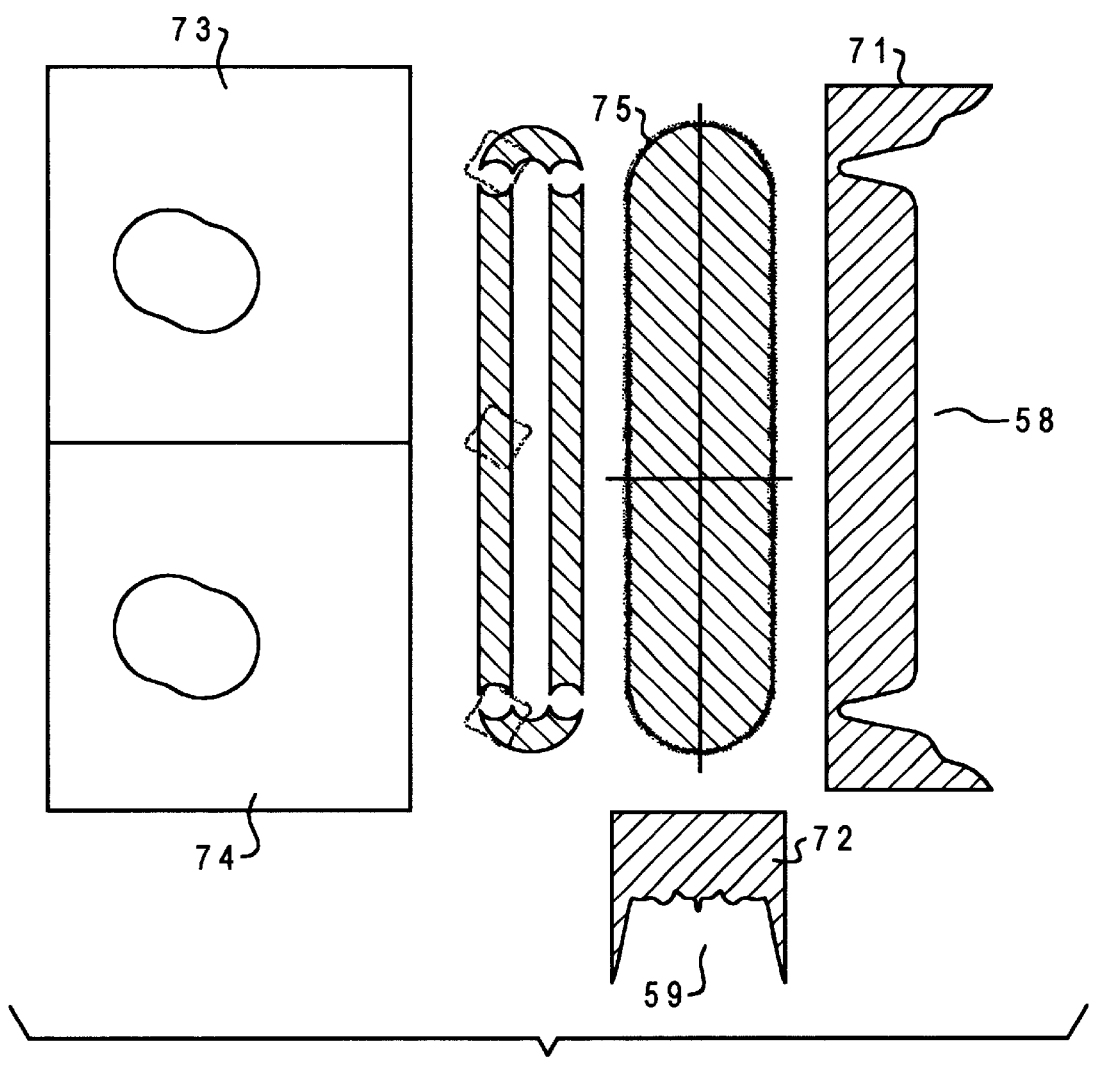
FIG. 14 shows yet a further preferred movement of the magnet assembly in accordance with the present invention and the resulting target erosion profiles parallel and perpendicular to the major axis of the race-track.

Still another motion in accordance with the present invention will be described with reference to FIG. 14. This was produced by a planar magnetron in accordance with the present invention with the movement of the magnet array produced by a modification of the device shown schematically in FIGS. 4–7 to produce epitrochoidal motions. The movement was epitrochoidal with the dimensions "a"=1, "b"=½ and "h"=¼. The race-track dimensions were r=371, s=13, t=51, l=450, w=110. The sideways movement of the magnet array, i.e. perpendicular to the longitudinal axis of the race-track, was 90% of the dimension "t". The target consumption over the long central portion of the target was 42% with an average for the complete target of 37%. The uniformity ratio in the central portion of the target 2 was over 80%. Some sputtering outside the target was encountered but this was negligible (~0.2%). The target erosion profiles 58, 59 parallel and perpendicular to the main axis of the race-track and at the centres thereof, respectively are represented in sections 71 and 72 respectively. The motion of the master motion generator 56 is given at 73 and for the dependent motion generator 57 at 74. A pictorial view of the depth of erosion (depending upon grey scale) is given in section 75. The erosion profile shows generally very uniform erosion with two peaks at the ends of the race-track similar to the peaks in FIG. 13. Replaceable end portions to the target are useful with this motion with which average consumptions for the middle portion of over 80% can be obtained.

The exact form of the optimal motion for any particular magnetron depends on a number of factors. One of these is the exact energy profile of the plasma across the width of the race-track. Some degree of experimentation may be needed to obtain uniform erosion results in accordance with the present invention. In selecting a suitable motion for a magnet assembly producing a substantially elongate race-track as shown representatively in FIG. 10a, the following general advice may be useful:

1. Motions of the magnet array over extended distances which lie exactly parallel or perpendicular to the elongate race-track should be avoided. Instead, it is preferred if the majority of the trace of the motion of the magnet array 4 is at varying angles to the long axis of the race-track, even if these angles are small.

2. Where a particular motion has dwell points, i.e. points in the trace of the motion when the magnet array 4 slows down considerably or stops, these dwell points may be staggered across the perpendicular and/or parallel directions with respect to the long axis of the race-track. For example, as shown in the motion of FIG. 13, the four corners of the roughly square motion are tilted away from the long axis of the race-track. The aim of this is to create a series of overlapping erosion grooves created by the dwell times in the corners in which the motion slows down during the change of direction. Similarly, in FIG. 14, the epitrochoidal motion (a nephroid) is not symmetrical with respect to the long axis of the race-track. The two dwell points where the trace makes a marked change of direction do not lie on the same line either parallel or perpendicular to the race-track. Thus, in accordance with one embodiment of the present invention, the symmetry of the trace of the motion of the magnet array 4 is offset by an angle from the symmetry of the race-track.

3. In some cases a prolate, reentrant, substantially epitrochoidal or hypotrochoidal motion (as shown in FIGS. 12, 1a, 2c and 2d) may be preferred to a reentrant, curtate, substantially epitrochoidal or hypotrochoidal motion (as shown in 13, 14, 1b, 1c, 1d, 2a and 2b). The looped cusps of the prolate forms may avoid the pronounced dwell times caused by the pointed cusps of the curtate forms. This is indicated by the excellent results obtained with the prolate motion shown in FIG. 12, despite the fact that the symmetry of the motion of the magnet array 4 according to this embodiment of the invention is the same as the race-track (no angular offset as described in point 2 above).

4. Generally, in accordance with the present invention, the hypotrochoidal or epitrochoidal motion should be relatively simple, that it should be of a low order, e.g. less than 10 and preferably 6 or less. Preferably the order is also greater than 1. By "order" is meant the number of cusps or corners within the trace of the motion, e.g. the trace of FIGS. 12 and 13 has order 4, whereas the trace of FIG. 14 has the order 2 and the trace of FIG. 11 (a circle) has order 0. A cardioid has an order of 1 (not shown).

The moving magnet assembly in accordance with the present invention may advantageously be used in reactive sputtering in which a reactive gas is introduced into the vacuum chamber, e.g. nitrogen or oxygen in addition to an inert gas such as argon. Reactive sputtered coatings are compounds, e.g. nitrides or oxides and are usually electrical insulators. During the sputtering, any surface portions of the target which are coated with the compound material become insulated and are charged with positive ions. The coating generally sputters at a very much lower rate than the pure metal. This is known as target poisoning. When the charge reaches a certain level arcing with the plasma race-track can occur resulting in serious damage to the target and/or the substrate and the deposition process is halted as all the energy goes into the arc. The problem is discussed in U.S. Pat. No. 5,507,931 for instance. In accordance with the present invention, the movement of the magnet assembly across almost the complete surface of the target prevents excessive build up of compound layers on the target by sputtering these to the substrate. As a result arcing is effectively eliminated.

The present invention may be used to advantage with AC switching of the targets during reactive sputtering. In this procedure two targets are placed close to each other and the target voltage is not a constant DC voltage but is rather an AC voltage, e.g. a sinusoidal or square wave, whereby the phase of the voltage for the two targets in 180° out of phase. When the one target is at negative potential the other target is at a positive potential. Only the target with a negative potential sputters to the substrate. The other target which is at a positive potential attracts any electrons or negative ions in the vicinity, repels the positive ions and becomes covered with a thin layer of the compound. On reversal of the potential on the targets, the previous anode becomes the cathode and the thin layer of compound is sputtered to the substrate after which the target is sputtered normally. To provide uniform sputtering with a moving substrate the two targets must be very close together. This results in the magnetic fields of the two magnet assemblies interfering with each other. Further, the magnetic field on the anodic target influences the motion of the electrons or negative ions, effectively increasing the impedance of the path to the anodic target.

In accordance with the present invention the magnet assemblies of the two adjacent targets may be given identical novel motions described above, synchronised in such a way that the plasma race-tracks are always at the same distance apart. This keeps the magnetic interference to a minimum. Secondly the magnetic field from the magnet array according to the present invention only covers a portion of the target area at any one time. Hence, for the anodic target there is sufficient free target surface not influenced by the magnetic field to operate effectively as a getter for electrons and negative ions. In accordance with the present invention parallelly arranged rectangular planar targets, each with an in-phase synchronised moving magnet assembly performing a motion in accordance with the present invention can provide optimum performance during AC switching of the targets.

The magnet assembly described above is simple and effective in providing the invention relative motion between the target and the magnet assembly. While the present invention has been shown and described with reference to preferred embodiments, it will be understood by those skilled in the art that various changes or modifications in form and detail may be made without departing from the scope and spirit of this invention. For instance, the skilled person will appreciate that the same novel effects could be obtained if the magnet assembly were stationary and the target is moved relative to the magnet assembly. It will be also understood by the skilled person that the inventive generally epicycloidal or hypotrochoidal motions in accordance with the present invention may be generated by other means. For instance, the moveable housing 5 may be driven by a robot under the control of a computer programmed to generate the respective traces.

In addition the plasma race-track in accordance with the present invention may be modified by using means known to the skilled person. For instance, the present invention includes a combination of the novel motions of the magnet assembly described above with broadening the track width at the ends of the race-track in accordance with the teachings of U.S. Pat. No. 5,364,518 or making the plasma race-track more pointed, triangular, elliptical or parabolic at its ends in accordance with the teachings of WO 96/21750 or DE-A-27 07 144. Furthermore, one or more of the magnets of the magnet assembly in accordance with the present invention may be inclined with respect to the plane of the target as disclosed in U.S. Pat. No. 5,130,005 (magnet 90) or may be provided with additional magnetic field shaping magnets in accordance with the teachings of U.S. Pat. No. 5,364,518 (magnet 59) or U.S. Pat. No. 5,130,005 (magnets 90, 95).

What is claimed is:

1. A planar magnetron having at least a surface for mounting a planar target comprising:

an array of magnets defining a closed loop magnetic field for generating an elongated plasma race-track above the target, means for establishing repetitive, relative, substantially translational movement between the race-track and the surface, the substantially translational movement being parallel to the surface and being in the form of a two-dimensional figure, characterised by the figure being generally epitrochoidal or hypotrochoidal in form.

2. A planar magnetron according to claim 1, wherein the figure is generated by a trace of a non-slipping movement of a point fixed with respect to a first substantially circular body on the outer or inner periphery of a second substantially circular body.

3. A planar magnetron according to claim 2, wherein the race-track has a symmetry and the symmetry of the figure is asymmetric with respect to the symmetry of the race-track.

4. A planar magnetron according to claim 1, wherein the race-track has a symmetry and the symmetry of the figure is asymmetric with respect to the symmetry of the race-track.

5. A planar magnetron according to claim 1, wherein the establishing means includes main drive means and dependent drive means receiving its motive power from the main drive means.

6. A planar magnetron according to claim 5, wherein the magnetron is disposed within a vacuum chamber and the dependent drive means does not penetrate the vacuum chamber.

7. A planar magnetron according to claim 1, wherein the magnetron is disposed within a vacuum chamber, wherein the establishing means comprises single drive means which penetrates into the vacuum chamber.

8. A planar magnetron according to claim 1, further comprising a housing for the establishing means and the magnet array, the housing being divided into two parts, a first part including the establishing means and a second part including the magnet array.

9. A planar magnetron according to claim 1, wherein the establishing means and the magnet array are self-guiding.

10. A method of operating a planar magnetron having at least a surface for mounting a planar target and an array of magnets defining a closed loop magnetic field, comprising the steps of:

generating an elongated plasma race-track above the target; and moving the plasma race-track relative to the surface, the movement being repetitive, substantially translational and parallel to the surface and the trace of the movement being a two-dimensional figure characterised by the figure having a generally hypotrochoidal or epitrochoidal form.

11. A method according to claim 10, wherein the movement between the race-track and the surface is generated by moving the array of magnets.

12. A method in accordance with claim 11, wherein the ratio of an average erosion to the peak erosion in at least the central portion of the target is at least 60%.

13. A method according to claim 12, wherein the race-track has a symmetry and the symmetry of the figure is asymmetric with respect to the symmetry of the race-track.

14. A method in accordance with claim 10, wherein the ratio of an average erosion to the peak erosion in at least the central portion of the target is at least 50%.

15. A method according to claim 10, wherein the race-track has a symmetry and the symmetry of the figure is asymmetric with respect to the symmetry of the race-track.

16. A planar magnetron including a surface for mounting a planar substantially polygonal target having a substantially central target area for sputtering onto a substrate, the magnetron comprising:
    an array of magnets defining a closed loop magnetic field for generating an elongated plasma race-track above the target,
    means for establishing cyclical, relative, substantially translational movement between the race-track and the surface,
    the substantially translational movement being substantially parallel to the surface,
    the trace of the substantially translational movement being a closed loop two-dimensional figure and the periphery of the race-track lying substantially within the substantially central target area during each cycle,
    the establishing means being adapted to provide a substantially uniform erosion of the target at least within the substantially central target area.

17. A planar magnetron according claim 16, wherein the figure is one of a generally hypotrochoidal or a generally epitrochoidal form.

18. A planar magnetron according to claim 17, wherein the ratio of an average erosion to the peak erosion in at least the central portion of the target is at least 60%.

19. A planar magnetron according to claim 18, further comprising means for establishing repetitive, relative, substantially translational movement between the magnet array and the surface.

20. A planar magnetron according to claim 19, wherein the repetitive, relative, substantially translational movement between the magnet array and the surface is parallel to the surface and is in the form of a two-dimensional figure, the figure being generally epitrochoidal or hypotrochoidal in form.

21. A planar magnetron according to claim 16, wherein the ratio of an average erosion to the peak erosion in at least the central portion of the target is at least 50%.

22. A planar magnetron according to claim 16, further comprising means for establishing repetitive, relative, substantially translational movement between the magnet array and the surface.

23. A planar magnetron according to claim 22, wherein the repetitive, relative, substantially translational movement between the magnet array and the surface is parallel to the surface and is in the form of a two-dimensional figure, the figure being generally epitrochoidal or hypotrochoidal in form.

24. A planar magnetron according to claim 16, wherein the magnetron is disposed within a vacuum chamber, wherein the establishing means comprises a single drive means which penetrates into the vacuum chamber.

25. A planar magnetron according to claim 16, wherein the establishing means includes main drive means and dependent drive means receiving its motive power from the main drive means.

26. A method of operating a planar magnetron including a surface for mounting a planar substantially polygonal target having a substantially central target area for sputtering onto a substrate, and an array of magnets defining a closed loop magnetic field for generating an elongated plasma race-track above the target, comprising the steps of:
    establishing cyclical, relative, substantially translational movement between the race-track and the surface, the substantially translational movement being substantially parallel to the surface, the trace of the movement being a closed loop two-dimensional figure and the periphery of the race-track lying substantially within the substantially central target area during each cycle, so that at least the substantially central target area is substantially uniformly eroded.

27. A method according to claim 26, wherein the relative movement between the race-track and the surface is generated by moving the array of magnets.

28. A method according to claim 26, wherein the figure is one of a generally hypotrochoidal or a generally epitrochoidal form.

29. A method in accordance with claim 28, wherein the ratio of an average erosion to the peak erosion in at least the central portion of the target is at least 60%.

30. A method according to claim 29, wherein the race-track has a symmetry and the symmetry of the figure is asymmetric with respect to the symmetry of the race-track.

31. A method according to claim 28, wherein the race-track has a symmetry and the symmetry of the figure is asymmetric with respect to the symmetry of the race-track.

32. A method in accordance with claim 26, wherein the ratio of an average erosion to the peak erosion in at least the central portion of the target is at least 50%.

33. A method according to claim 26, wherein the race-track has a symmetry and the symmetry of the figure is asymmetric with respect to the symmetry of the race-track.

* * * * *